United States Patent
Lee

(10) Patent No.: US 10,042,565 B2
(45) Date of Patent: Aug. 7, 2018

(54) ALL-FLASH-ARRAY PRIMARY STORAGE AND CACHING APPLIANCES IMPLEMENTING TRIPLE-LEVEL CELL (TLC)-NAND SEMICONDUCTOR MICROCHIPS

(71) Applicant: Futurewei Technologies, Inc., Plano, TX (US)

(72) Inventor: Xiaobing Lee, Santa Clara, CA (US)

(73) Assignee: Futurewei Technologies, Inc., Plano, TX (US)

( * ) Notice: Subject to any disclaimer, the term of this patent is extended or adjusted under 35 U.S.C. 154(b) by 153 days.

(21) Appl. No.: 14/729,817

(22) Filed: Jun. 3, 2015

(65) Prior Publication Data
US 2016/0110126 A1    Apr. 21, 2016

Related U.S. Application Data

(60) Provisional application No. 62/064,914, filed on Oct. 16, 2014.

(51) Int. Cl.
*G06F 3/06* (2006.01)
*G11C 11/56* (2006.01)
*G11C 16/04* (2006.01)

(52) U.S. Cl.
CPC .......... *G06F 3/0619* (2013.01); *G06F 3/0655* (2013.01); *G06F 3/0688* (2013.01); *G11C 11/5628* (2013.01); *G11C 16/0483* (2013.01)

(58) Field of Classification Search
CPC .... G06F 3/0619; G06F 3/0655; G06F 3/0688; G06F 3/0679; G06F 3/0616; G06F 12/0246; G06F 2212/7206; G06F 2212/7207; G06F 2212/7209; G11C 11/5628; G11C 11/5635; G11C 11/56; G11C 11/5621; G11C 16/0483; G11C 16/02; G11C 16/04; G11C 16/10
See application file for complete search history.

(56) References Cited

U.S. PATENT DOCUMENTS 8,213,228 B1 * 7/2012 Yang .................. G11C 11/5628
                                                    365/185.03
8,595,606 B1 * 11/2013 Feng ................. H03M 13/2909
                                                    714/800

(Continued)

OTHER PUBLICATIONS

Tang et al., Management Schemes for NAND Flash with Variable-Sized Cache, U.S. Appl. No. 62/060,387, filed Oct. 6, 2014.*

(Continued)

*Primary Examiner* — Michael Krofcheck
(74) *Attorney, Agent, or Firm* — Schwegman Lundberg & Woessner, P.A.

(57) ABSTRACT

A computer-implemented method for storing and caching data in an all-flash-array includes erasing a TLC-NAND flash cell and programming the cell with a binary value multiple times in sequence corresponding to multiple sequential stages between erasures. The method also includes processing the binary value in relation to a respective threshold voltage at each of the multiple sequential stages. The method further includes storing metadata corresponding to a current stage associated with the number of times the TLC-NAND flash cell has been programmed since being erased.

25 Claims, 12 Drawing Sheets

(56) References Cited

U.S. PATENT DOCUMENTS

| | | | | |
|---|---|---|---|---|
| 2007/0253256 A1* | 11/2007 | Aritome | ............. | G11C 11/5628 365/185.24 |
| 2008/0168215 A1* | 7/2008 | Jiang | ................. | G06F 11/1072 711/103 |
| 2012/0020155 A1* | 1/2012 | Kim | ................. | G11C 11/5628 365/185.03 |
| 2013/0297853 A1* | 11/2013 | Balakrishnan | ...... | G06F 12/0866 711/103 |
| 2013/0311823 A1* | 11/2013 | Kaplan | ............... | G06F 11/2023 714/15 |
| 2014/0047160 A1* | 2/2014 | Lin | ..................... | G11C 11/5628 711/103 |
| 2014/0146605 A1* | 5/2014 | Yang | ................. | G11C 11/5628 365/185.03 |
| 2014/0226412 A1* | 8/2014 | Yeh | ..................... | G11C 11/5628 365/185.21 |
| 2014/0244912 A1* | 8/2014 | Birk | .................... | G06F 12/0246 711/103 |
| 2014/0313822 A1* | 10/2014 | Zeng | .................. | G11C 16/3427 365/185.02 |
| 2015/0193302 A1* | 7/2015 | Hyun | .................... | G11C 29/52 714/764 |
| 2016/0098216 A1* | 4/2016 | Huang | ................ | G06F 11/1072 714/37 |
| 2016/0098350 A1* | 4/2016 | Tang | ................... | G06F 12/0871 711/103 |

OTHER PUBLICATIONS

Jiang, et al, "Floating Codes for Joint Information Storage in Write Asymmetric Memories," Jun. 2007, 2007 IEEE International Symposium on Information Theory.*

* cited by examiner

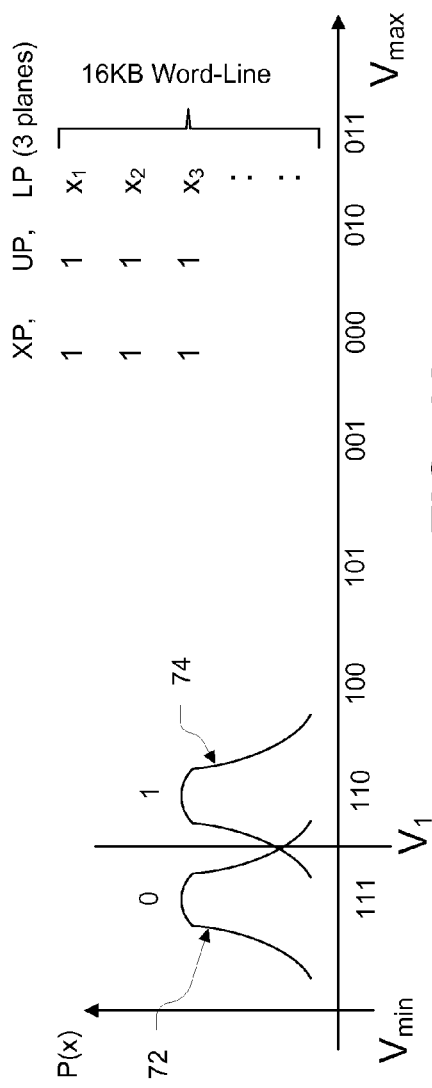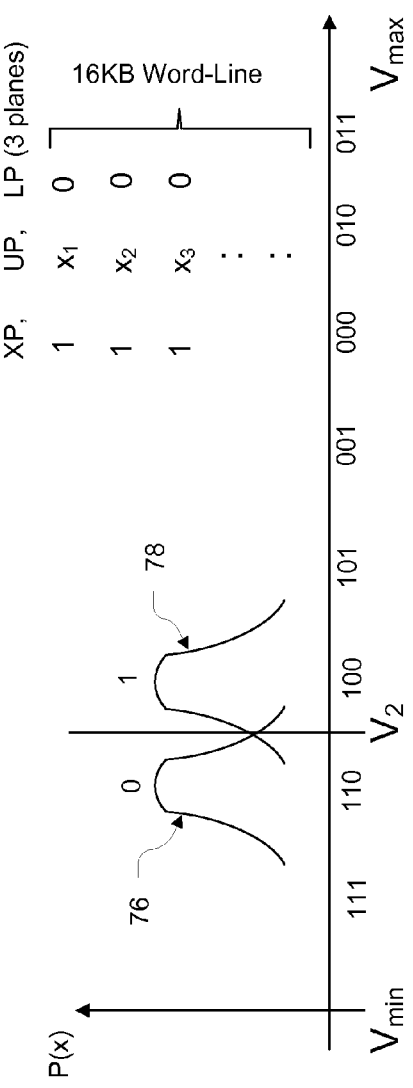

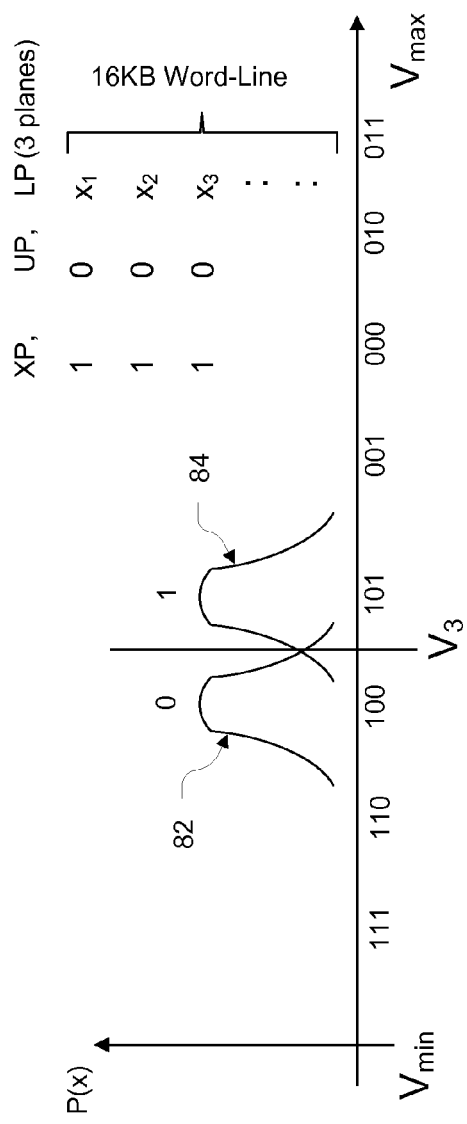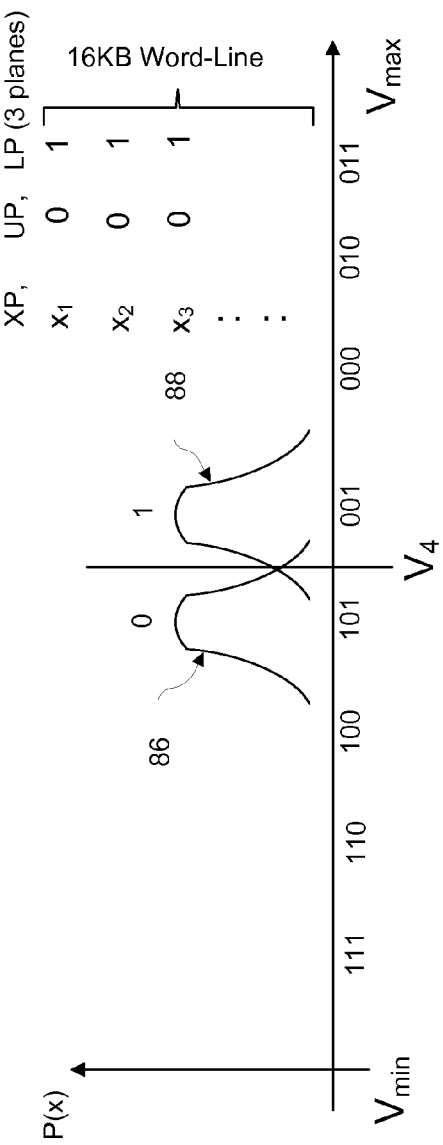

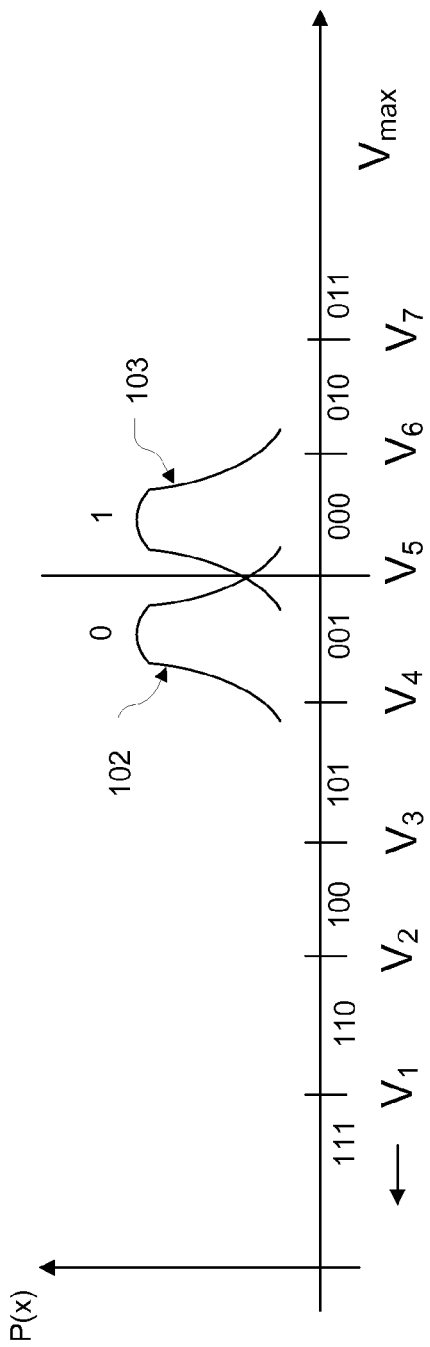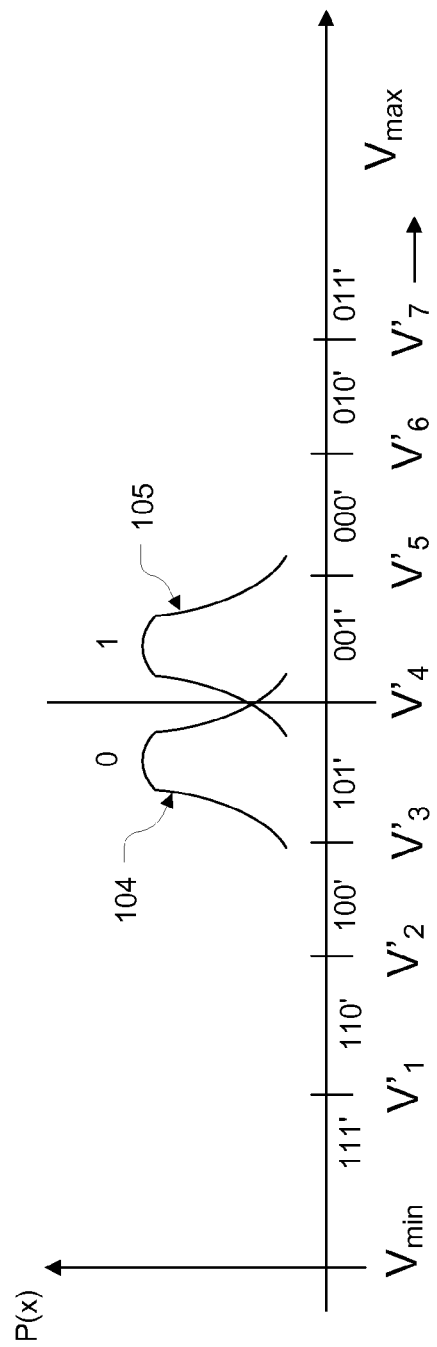

ALL-FLASH-ARRAY PRIMARY STORAGE AND CACHING APPLIANCES IMPLEMENTING TRIPLE-LEVEL CELL (TLC)-NAND SEMICONDUCTOR MICROCHIPS

CROSS-REFERENCE TO RELATED APPLICATIONS

This application claims the benefit of U.S. Provisional Application Ser. No. 62/064,914, filed Oct. 16, 2014, which is incorporated by reference herein.

TECHNICAL FIELD

This description relates generally to computer storage solutions, and more particularly to flash memory-based primary storage systems and caching appliances implementing triple-level cell (TLC)-NAND semiconductor microchips.

BACKGROUND

Primary storage systems and caching appliances typically are used to store digital data associated with high-performance, networked computer systems. High-performance primary storage appliances generally include nonvolatile memory embodied in an integrated circuit, or semiconductor microchip, variously implemented in a storage memory array included on a circuit board in a computer or as a peripheral, or stand-alone, component. Caching appliances generally include a nonvolatile memory microchip, or set of microchips, located on or relatively near the central processing unit, or microprocessor chip, that provides relatively short-term temporary storage of data that has been relatively recently used by the processor or is likely to be used by the high performance data centers relatively soon.

In some existing configurations, or architectures, cache may refer to a dedicated, relatively high-speed, special-purpose microchip, while in other configurations cache may refer to a section or multiple segments of the general storage area apportioned for use as cache. In the latter case, the section or multiple segments of storage used as cache may remain static over time or may be dynamically reallocated among primary storage for caching over time.

Traditionally, relatively large, network-based storage devices have been implemented by magnetic hard-disk drives (HDD). More recently, some existing primary storage devices and caching appliances have implemented solid-state disk drives, such as "flash" memory that is made using arrays of NAND gates.

Existing single-level cell (SLC)-NAND integrated circuits have formed the basis for relatively high-speed primary storage and caching appliances. Given the relatively high performance, low power consumption, relatively fast read/write operation speeds, and endurance limit or life-cycle (reportedly as high as 100,000 program/erase cycles per cell), some all-flash-array primary storages made entirely or mostly of SLC-NAND memory chips have been implemented for use in industrial grade devices, embedded systems and critical applications, such as high-performance enterprise data centers, despite the relatively high cost of manufacturing these devices.

Some existing two-level, multi-level cell (MLC)-NAND integrated circuits can be manufactured at a relatively lower cost, but these also exhibit a significantly lower endurance limit or life-cycle (reportedly as high as 10,000 program/erase cycles per cell). Existing MLC-NAND integrated circuits have formed the basis for relatively high-speed storage in some consumer products.

Recently, the industry has taken interest in tri- or triple-level cell (TLC)-NAND integrated circuits, in significant part due to the relatively low cost of manufacture. TLC-NAND chips have a relatively high chip device density, providing up to three times the storage capacity of existing SLC-NAND chips, but exhibit slower read and write operation speeds than existing MLC-NAND memory chips. For example, TLC-NAND cells have been programmed in one-page (3×16 KB planes) or 3×16 KB (XP, UP, LP) planes, and read in three planes, one-by-one. The read/write latencies typically have been longer than MLC-NAND (two planes) and SLC-NAND chips.

In addition, existing TLC-NAND chips typically exhibit a relatively low endurance limit or lifecycle (on the order of 1,000 to 3,000 program/erase cycles per cell). Some TLC-NAND blocks can reportedly reach as many as 10,000 program/erase cycles when configured and used in SLC-mode, which, of course, reduces the memory capacity by two-thirds. In general, a block configured in SLC-mode to provide longer endurance could not be subsequently reconfigured back to TLC-mode to provide reliable storage capacity.

Thus, in some relatively demanding caching applications, for example, an existing 200 terabyte (TB) TLC-NAND SSD with a 200 Gbps write rate could wear out within six months of use. As a result, existing TLC-NAND memory chips typically have been limited to low-cost consumer storage devices, or commodity hardware, but typically have not been implemented in critical applications requiring frequent updating of data, such as high-performance enterprise data centers.

SUMMARY

According to one embodiment of the present invention, a method for caching data in an all-flash-array storage includes erasing a TLC-NAND flash cell and programming the cell with an arbitrary binary value multiple (m) times in sequence corresponding to multiple sequential programming stages with different coding patterns between erasures for caching equivalent m-bits data or prolonging cell lifecycles m times. The method also includes interpreting the binary value in relation to a respective threshold voltage at each of the multiple sequential stages and storing metadata corresponding to a current programming stage associated with the number of times the TLC-NAND flash cell has been programmed since being erased.

According to another embodiment of the present invention, a method for storing and caching data in an all-flash-array includes erasing a TLC-NAND flash cell and programming a first cell voltage level of the cell corresponding to a first binary value where the first binary value equals a first logical value if the first cell voltage level is within a first probability distribution function having a first orientation with respect to a first threshold voltage or a second logical value if the first cell voltage level is within a second probability distribution function having a second orientation with respect to the first threshold voltage. The method further includes storing a first stage metadata value associated with a number of times the TLC-NAND flash cell has been programmed since the TLC-NAND flash cell last was erased. The stage value is per TLC-NAND page based metadata overhead and the cells erasure is per block operations.

According to yet another embodiment of the present invention, an apparatus for storing and caching data in an all-flash-array includes an array of flash memory modules consisting of triple-level cell (TLC)-NAND devices, a memory array controller coupled to the array of flash memory modules to manage data transfer to and from the array of flash memory modules, and a remote direct memory access to manage data transfer to and from the apparatus. At any time, no more than five percent of the TLC-NAND devices' blocks are dedicated to a cache region and at least a portion of the remaining devices' blocks are dedicated to non-cache primary storage. Each of the blocks dedicated to the cache region is programmed with a binary value multiple times in sequence corresponding to multiple sequential stages between erasures for caching m-bits info. The binary value is interpreted in relation to a respective threshold voltage at each of the multiple sequential stages. Furthermore, the dedicated cache region will be rotated within the coolest blocks (stored data for longer times) thru the primary storage region periodically for better block wear-leveling among entire AFA devices.

According to yet another embodiment of the present invention, an apparatus for fast reading the caching cells stored with particular 3-bit coding patterns and then decoding the single-bit cached info by reading one of XP, UP, or LP planes of a TLC-NAND caching page for better latency than primary storage TLC-NAND blocks.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIGS. 4A through 4G are a set of graphs depicting exemplary probability distribution functions associated with threshold voltages of TLC-NAND flash memory in accordance with an embodiment of the present invention.

FIGS. 5A through 5C are a set of graphs depicting exemplary probability distribution functions associated with a trimmed threshold voltage of a TLC-NAND flash memory in accordance with an embodiment of the present invention.

DETAILED DESCRIPTION

Figure 1:
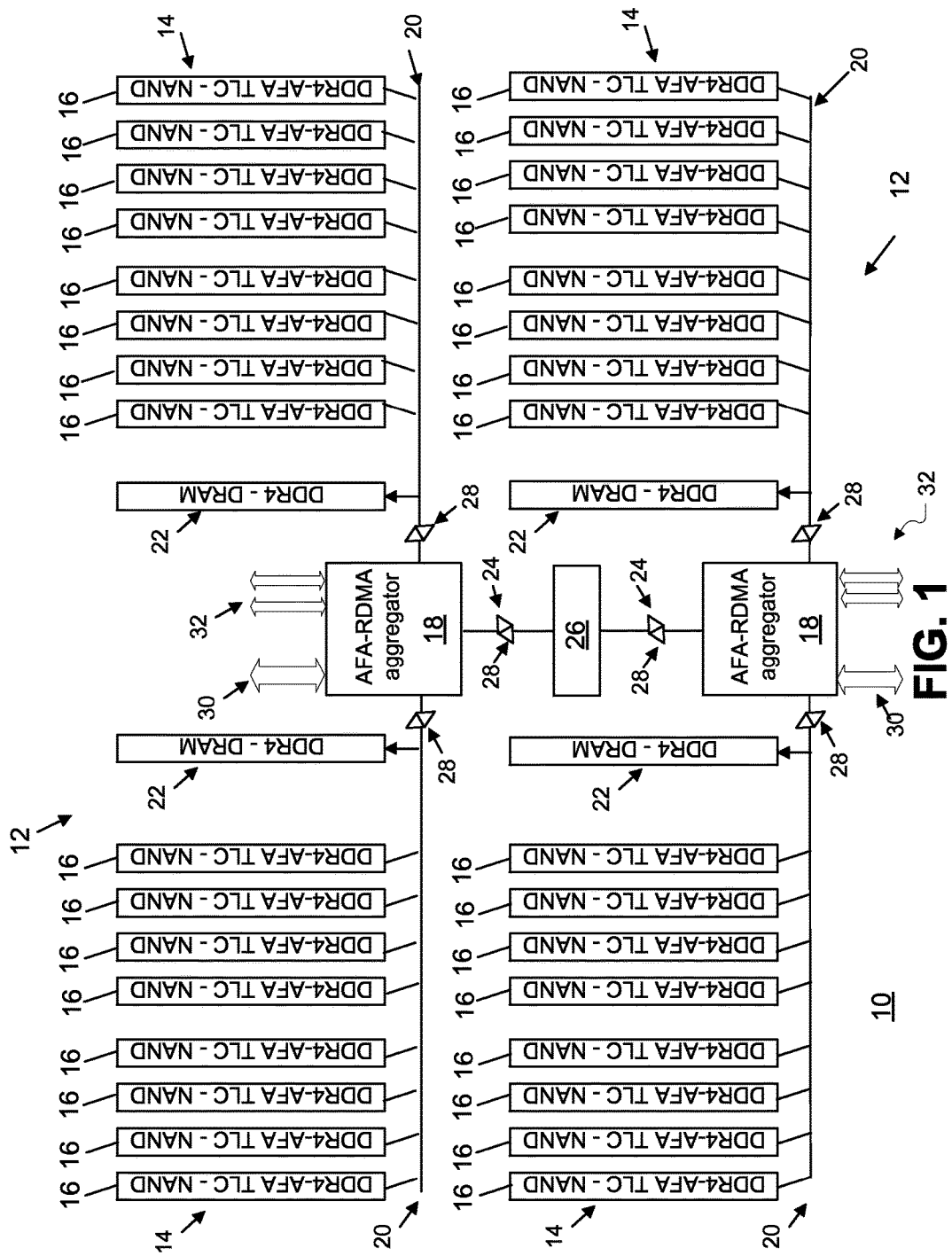
FIG. 1 is a schematic view illustrating an exemplary architecture of an all-flash-array triple-level cell (TLC)-NAND storage device in accordance with an embodiment of the present invention.

This disclosure describes an apparatus and method for implementing triple-level cell (TLC)-NAND flash storage media in high-performance, critical enterprise applications. An embodiment of the present invention is shown in FIG. 1, which illustrates an exemplary architecture of an all-flash-array TLC-NAND storage node 10 that employs an erase-once-write-multiple-times process in order to increase the dynamic effective storage capacity and lifecycle of the caching blocks of the TLC-NAND storage node 10. The TLC-NAND storage node 10 includes two flash memory data storage arrays 12, each of which includes two banks 14 of eight DDR4-AFA flash memory modules 16 connected to an AFA-RDMA aggregator of memory array controller 18 by way of a data link 20 and a journaling buffer 22, or journaling cache DDR4-DRAMs. The two arrays 12 are interconnected by way of an inter-array data link 24 and an inter-array buffer 26 DDR4-MRAM non-volatile memory device. Six on/off switches 28 are provided to control the data links 20, 24. Each memory array controller 18 includes a host port to provide for PCIe direct communication with a host CPU and a dual fabric port 32 to provide for communications by a remote direct memory access (RDMA).

The AFA-RDMA memory array controllers 18 manage data transfer to and from the banks 14 of DDR4-AFA flash memory modules 16, and communicate with a host CPU to manage functions including the flash file system directory, wear leveling, error correction and garbage collection. The journaling buffers 22 facilitate data transfer between the memory array controllers 18 and the banks 14 of flash memory modules 16. The inter-array buffer 26 DDR4-MRAM non-volatile write-cache also facilitates data transfer between the two memory arrays 12. In addition to 3-bit primary storage, each TLC-NAND flash cell of the storage device 10 could be programmed multiple times as caching blocks, for example, up to seven times, or up to eight times, between erasures using the method described in this disclosure.

In an embodiment, the flash memory modules 16 have a double data rate (DDR)4-AFA dual in-line memory module (DIMM) form factor. These can include commodity-grade solid state drives (TLC-SSDs), which results in a relatively lower system cost and better flash disk performances.

Figure 2:
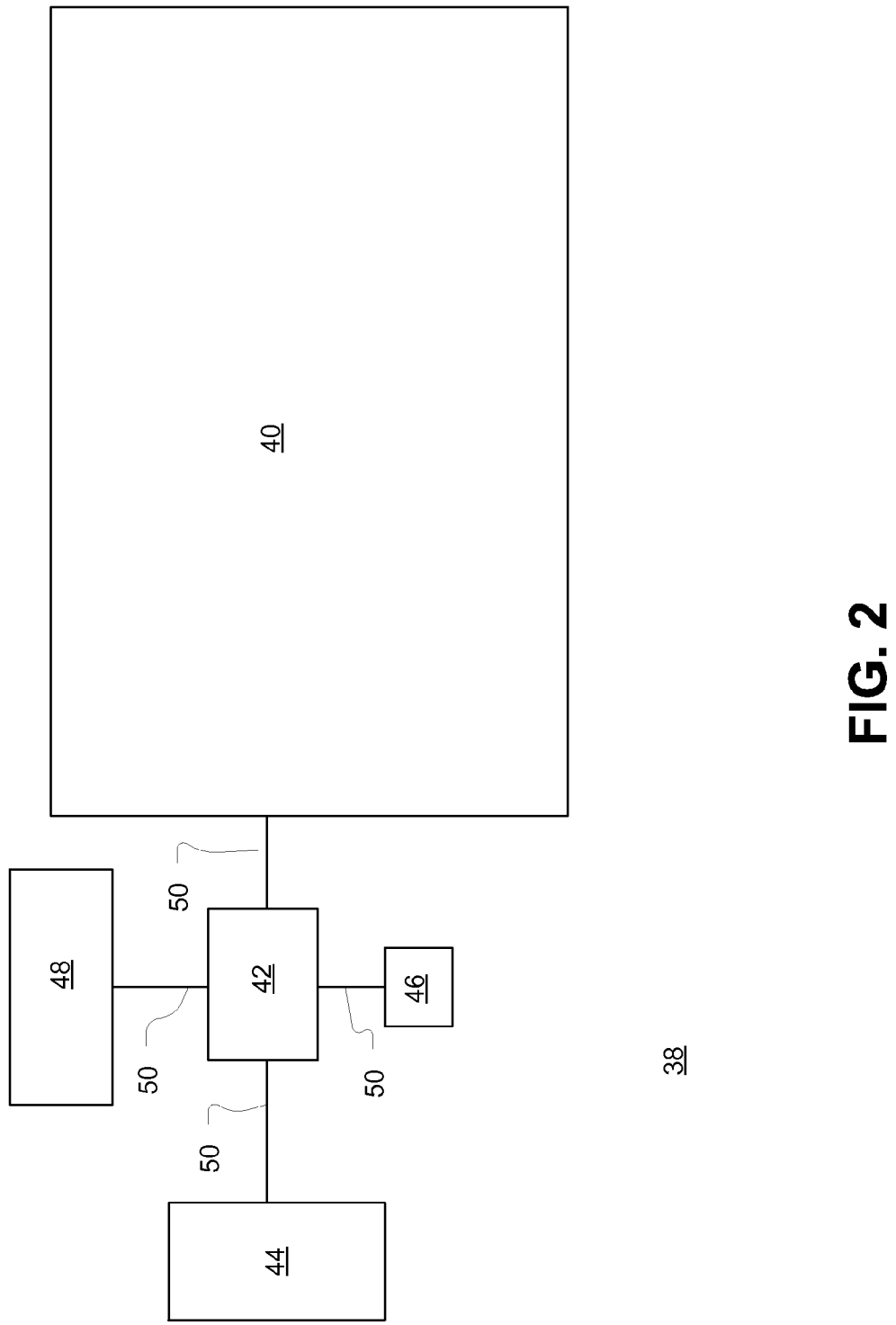
FIG. 2 is a block diagram depicting an exemplary architecture of a primary storage and caching apparatus that employs the all-flash-array TLC-NAND storage device of FIG. 1 in accordance with an embodiment of the present invention.

Referring to FIG. 2, an exemplary architecture of a primary storage and caching apparatus 38 is depicted. The apparatus 38 includes an array cluster 40, which incorporates multiple all-flash-array TLC-NAND storage devices 10 of FIG. 1. The primary storage and caching apparatus 38 further includes a remote direct memory access (rDMA) unit, or central memory controller 42, a Fiber Channel (FC) or TCP offloading engine (TOE) 44 and an erasure coding unit 46. The primary storage and caching apparatus 38 optionally includes a virtual gateway array 48. The individual components of the primary storage and caching apparatus 38 are communicatively connected by a data links 50.

In an embodiment, the all-flash-array primary storage and caching apparatus 38 is architected with an N×N array cluster 40, for example, sixteen all-flash-array TLC-NAND storage devices 12, each of which includes sixteen flash memory modules 16, forming a 16×16 array cluster. Sixteen AFA-RDMA aggregating controllers of ARM-core field-programmable gate arrays (FPGA), with non-volatile memory express (NVMe) ports or non-volatile memory host controller interface specification (NVM-HCI) ports, each interconnect sixteen of the DDR4-AFA DIMM modules. For example, 16 DDR4-SSD DIMM modules can be shared by one networking FPGA along with one LDPC-ECC controller. Each DIMM can include an onboard, distributed SSD controller, such as an ONFI TLC-NAND controller.

Figure 3:
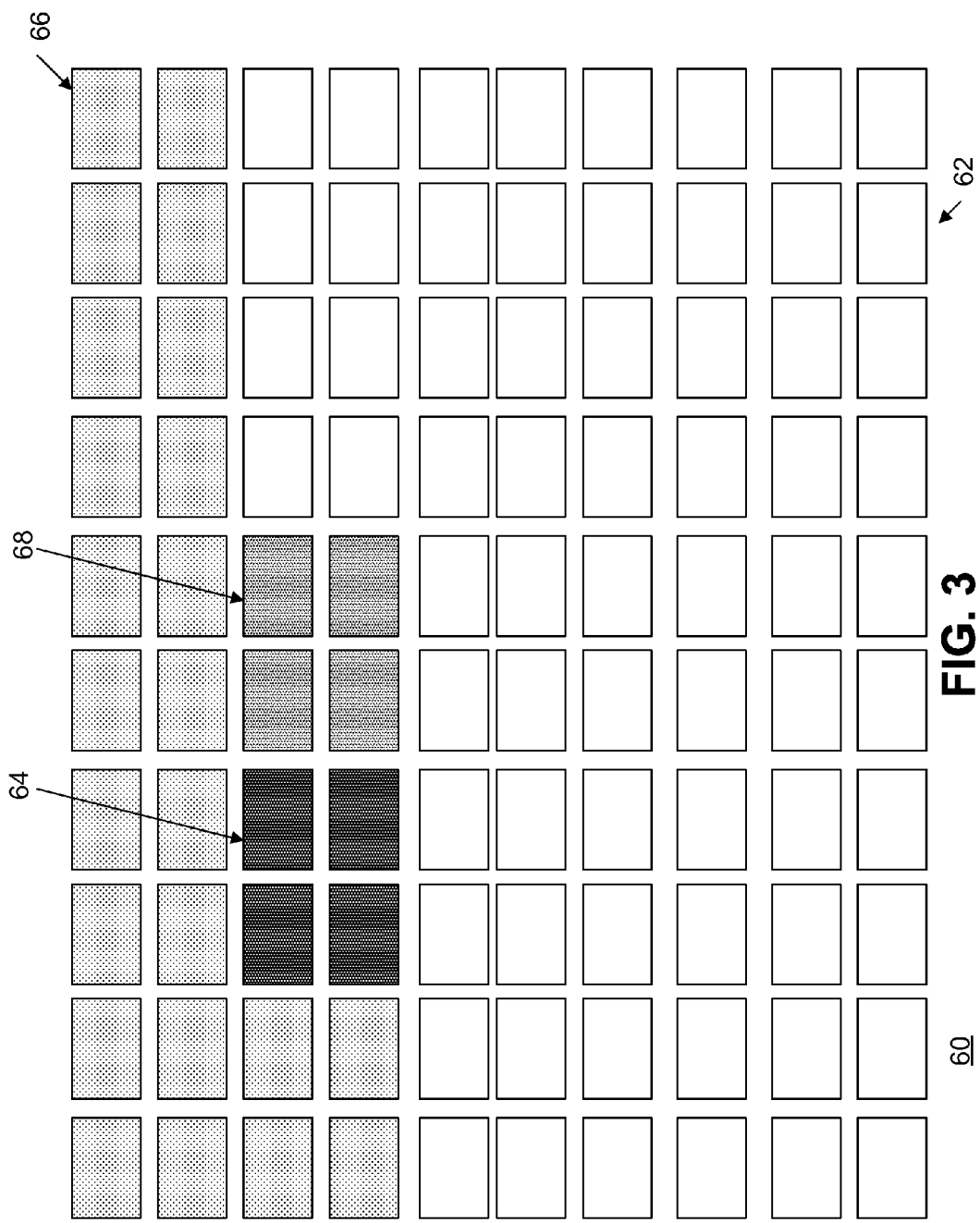
FIG. 3 is a block diagram depicting an exemplary rotation scheme for virtual memory blocks stored in the primary storage and caching apparatus of FIG. 2 in accordance with an embodiment of the present invention.

Referring to FIG. 3, an exemplary flash storage space 60 is divided into one hundred equal units, segments, or blocks 62, of flash cells, for example, 3×2 MB each. Each block 62 is further subdivided into pages, for example, 3×16 KB for TLC-NAND. In general, NAND flash can be accessed or read one page at a time, and erased on a per-block basis.

In general, data can be divided into categories based on the relative frequency of erase, write and read operations performed, or expected to be performed, on the data. For example, "cold" data refers to long-time storage data that receives relatively few read operations and relatively rare erase and write operations. In the same vein, "hot" data refers stored data that receives relatively higher frequent read operations and more often erase and write operations. "Caching" refers to relatively short-term storage that is subject to relatively high frequency read, write and erase operations with about 80% to 20% read/write ratio. The "hottest" data refers to data stored in DDR4-DRAM with about 50% to 50% read/write ratio.

At any given time, in an embodiment of the present invention, a relatively small portion, or segment, of the total all-flash-array is assigned to function as cache. For example, a four-block cache region 64 (shown in FIG. 3 with dark shading) is assigned as the current logical cache region. The remaining 96 blocks are currently assigned as primary storage committed to "cold" data, or relatively long-term, non-caching storage, having relatively low erase-wearing rates. In various embodiments, for example, the current cache can be apportioned to about 5 percent, less than two percent, or less than one percent of the total storage capacity in huge AFA primary storage clusters.

The cache region 64 is periodically rotated through the static-capacity storage space 60 over time to allow even wearing of erase and write cycles throughout the entire storage space 60. Previous to being assigned to the current physical location, the cache region 64 has previously been moved through the lightly-shaded previous area 66 of the storage space 60. The cache region 64 next will be moved to the medium-shaded next area 68 of the storage space 60, and so on. In this manner, the relatively frequent read, write and erase operations performed on the current cache results in relatively even wear, or wear leveling, in all blocks 62 of the storage space 60.

For example, in an embodiment, the cache region 64 is moved at intervals of equal time spaced apart to approximately rotate the cache region 64 through the entire storage space during the expected lifetime of the flash storage. In another embodiment, the cache region 64 is moved at more frequent intervals to rotate the cache region 64 through the entire storage space multiple times during the expected lifetime of the flash storage.

In addition, the lifespan of the TLC-NAND flash storage can be expanded by implementation of multiple write operations per erase operation, such as the erase-once-write-multiple-times TLC-NAND data-caching programming method described in this disclosure. The erase-once-write-seven-times method makes use of the seven threshold voltages, $V_{th}$ ($V_1, V_2, \ldots V_7$), commonly used to separate eight programming signal levels, or cell voltage levels, generally interpreted as three bits per cell in TLC-NAND chip programming. However, the erase-once-write-multiple-times method interprets, or decodes, the signal levels in a different manner than that generally employed in existing TLC-NAND chip programming schemes. Each programming signal level, or cell voltage level, is interpreted as a single bit of data, that is, as a binary value, such as a single-digit binary number, logical setting, or the like (for example, "0" or "1," "true" or "false," "T" or "F," "on" or "off"). For example, each TLC-NAND flash cell has two (of three) bits masked out by a fixed coding pattern, and stored only one data bit at a time.

After each of up to seven programming, or write, operations, the cell voltage level is interpreted according to the current stage, or number of programming operations performed since the most recent erasure. Referring to FIG. 4A, the logic [0, 1] value could be encoded and programmed as a 3-bit coding pattern [111, 110] such that the logic [0] written as [111] then the logic [1] as [110.]Reading the cells, the probability distribution functions 72, 74 are used in the first programming stage, that is, following the first write operation after an erasure, to decode or interpret the meaning of the cell voltage level. If the signal level falls within the probability distribution function 72, $p^{(0)}(x)$ [less than threshold voltage, $V_1$, that is, oriented below $V_1$], which normally is interpreted as "111," then the single-bit encoding of the cell in stage one is interpreted as logical "zero," or "0." Otherwise, if the signal level falls within the probability distribution function 74, $p^{(1)}(x)$ [greater than threshold voltage, $V_1$, that is, oriented above $V_1$, opposite the probability distribution function 72 and forming a mirror image of the probability distribution function 72 with respect to the vertical axis of $V_1$], which normally is interpreted as "110," then the single-bit encoding of the cell in stage one is interpreted as logical "one," or "1." As fast reading/decoding process of the first programming stage, the low plane of TLC-NAND page could be read, then decoded LP bit [1] as logic value [0] and LP bit [0] as logic value [1]. Meanwhile, the voltage values other than [111, 110] are errors and correctable by ECC process.

Referring to FIG. 4B, the logic [0, 1] value could be encoded and programmed as a 3-bit coding pattern [110, 100] such that the logic [0] written as [110] then the logic [1] as [100]. Reading the cells, the probability distribution functions 76, 78 are used in the second stage, that is, following the second write operation after an erasure, to decode the cell voltage level. If the signal level falls within the probability distribution function 76, $p^{(0)}(x)$ [less than threshold voltage, $V_2$], which normally is interpreted as "110, " then the single-bit encoding of the cell in stage two is interpreted as logical "zero," or "0." Otherwise, if the signal level falls within the probability distribution function 78, $p^{(1)}(x)$ [greater than threshold voltage, $V_2$], which normally is interpreted as the three bits, "100," then the single-bit encoding of the cell in stage two is interpreted as logical "one," or "1." Note that the signal level normally interpreted as "110 " can be used in either or both stages one and two, but is interpreted differently in the two stages (as "1" in stage one or as "0" in stage two). As fast reading/decoding the second programming stage, the up plane of TLC-NAND page could be read then decoded UP bit [1] as logic value [0] and UP bit [0] as logic value [1]. Meanwhile, the voltage values other than [110, 100] are errors and correctable by ECC process.

Referring to FIG. 4C, the logic [0, 1] value could be encoded and programmed as a 3-bit coding pattern [100, 101 ] such that the logic [0] written as [100] and the logic [1] as [101]. Reading the cells, the probability distribution functions 82, 84 are used in the third stage, that is, following the third write operation after an erasure, to interpret the meaning of the cell voltage level. If the signal level falls within the probability distribution function 82, $p^{(0)}(x)$ [less than threshold voltage, $V_3$], which normally is interpreted as "100," then the single-bit encoding of the cell in stage three is interpreted as "0." Otherwise, if the signal level falls within the probability distribution function 84, $p^{(1)}(x)$ [greater than threshold voltage, $V_3$], which normally is interpreted as "101," then the single-bit encoding of the cell in stage three is interpreted as "1." Note that the signal level normally interpreted as "100" can be used in either or both stages two and three, but is interpreted differently in the two stages (as "1" in stage two or as "0" in stage three). As fast reading/decoding in the third programming stage, the low plane of TLC-NAND page could be read then decoded LP bit [0] as logic value [0] and LP bit [1] as logic value [1]. Meanwhile, the voltage values other than [100, 101] are errors and correctable by ECC process.

Referring to FIG. 4D, the logic [0, 1] value could be encoded and programmed as a 3-bit coding pattern [101, 001] such that the logic [0] written as [101] and the logic [1] as [001].]Reading the cells, the probability distribution functions 86, 88 are used in the fourth stage, that is, following the fourth write operation after an erasure, to decode the cell voltage level. If the signal level falls within the probability distribution function 86, $p^{(0)}(x)$ [less than threshold voltage, $V_4$], which normally is interpreted as "101," then the single-bit encoding of the cell in stage four is interpreted as "0." Otherwise, if the signal level falls within the probability distribution function 88, $p^{(1)}(x)$ [greater than threshold voltage, $V_4$], which normally is interpreted as "001," then the single-bit encoding of the cell in stage four is interpreted as "1." Note that the signal level normally interpreted as "101" can be used in either or both stages three and four, but is interpreted differently in the two stages. As fast reading/decoding in the fourth programming stage, the extra plane of TLC-NAND page could be read then decoded XP bit [1] as logic value [0] and XP bit [0] as logic value[1]. Meanwhile, the voltage values other than [101, 001] are errors and correctable by ECC process.

Figure 4E:
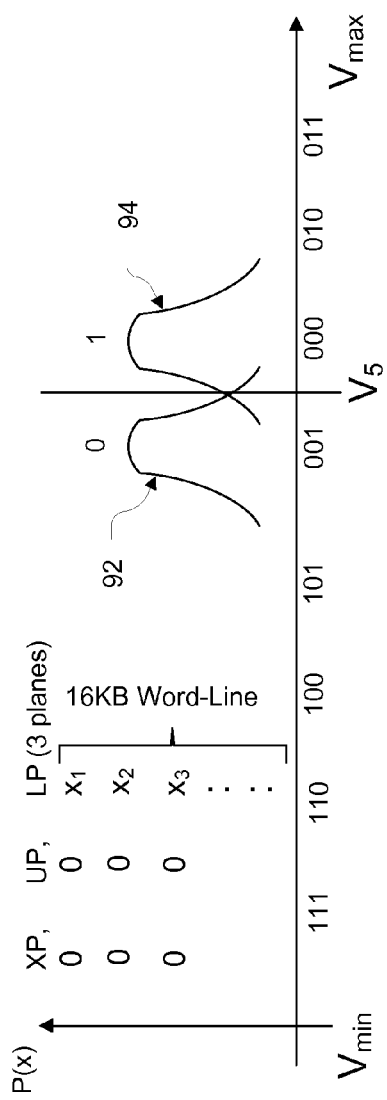

Referring to FIG. 4E, the logic [0, 1] value could be encoded and programmed as a 3-bit coding pattern [001, 000] such that the logic [0] written as [001] then the logic [1] as [000]. Reading the cells, the probability distribution functions 92, 94 are used in the fifth stage, that is, following the fifth write operation after an erasure, to interpret the meaning of the cell voltage level. If the signal level falls within the probability distribution function 92, $p^{(0)}(x)$ [less than threshold voltage, $V_5$], which normally is interpreted as "001," then the single-bit encoding of the cell in stage five is interpreted as "0." Otherwise, if the signal level falls within the probability distribution function 94, $p^{(1)}(x)$ [greater than threshold voltage, $V_5$], which normally is interpreted as "000," then the single-bit encoding of the cell in stage five is interpreted as "1." Note that the signal level normally interpreted as "001" can be used in either or both stages four and five, but is interpreted differently in the two stages. As fast reading/decoding in the fifth programming stage, the low plane of TLC-NAND page could be read then decoded LP bit [1] as logic value [0] and LP bit [0] as logic value [1]. Meanwhile, the voltage values other than [001, 000] are errors and correctable by ECC process.

Figure 4F:
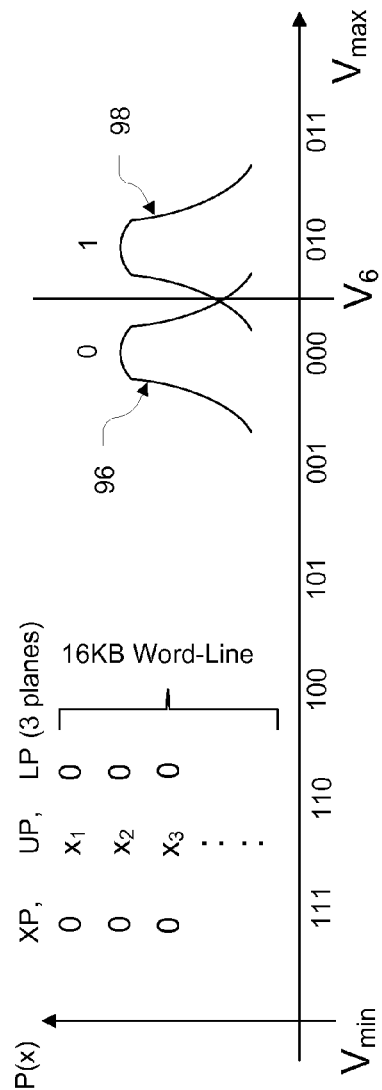

Referring to FIG. 4F, the logic [0, 1] value could be encoded and programmed as a 3-bit coding pattern [000, 010] such that the logic [0] written as [000] then the logic [1] as [010]. Reading the cells, the probability distribution functions 96, 98 are used in the sixth stage, that is, following the sixth write operation after an erasure, to decode the cell voltage level. If the signal level falls within the probability distribution function 96, $p^{(0)}(x)$ [less than threshold voltage, $V_6$], which normally is interpreted as "000," then the single-bit encoding of the cell in stage six is interpreted as "0." Otherwise, if the signal level falls within the probability distribution function 98, $p^{(1)}(x)$ [greater than threshold voltage, $V_6$], which normally is interpreted as "010," then the single-bit encoding of the cell in stage six is interpreted as "1." Note that the signal level normally interpreted as "000" can be used in either or both stages five and six, but is interpreted differently in the two stages. As fast reading/decoding in the sixth programming stage, the up plane of TLC-NAND page could be read then decoded UP bit [0] as logic value [0] and LP bit [1] as logic value [1]. Meanwhile, the voltage values other than [000, 010] are errors and correctable by ECC process.

Figure 4G:
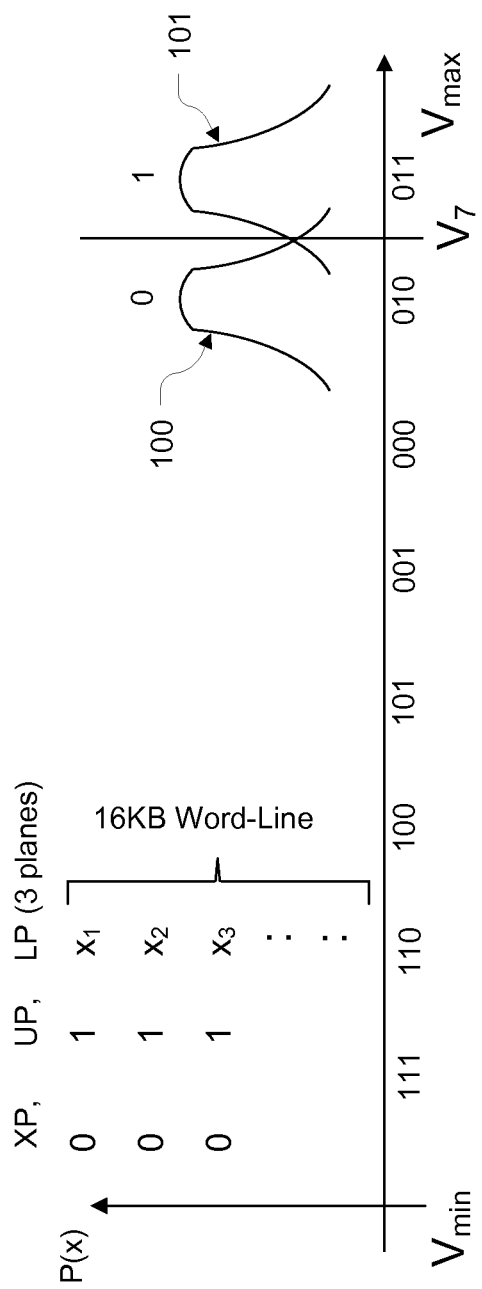

Referring to FIG. 4G, the logic [0, 1] value could be encoded and programmed as a 3-bit coding pattern [010, 011] such that the logic [0] written as [010] then the logic [1] as [011]. Reading the cells, the probability distribution functions 100, 101 are used in the seventh stage, that is, following the seventh write operation after an erasure, to interpret the meaning of the cell voltage level. If the signal level falls within the probability distribution function 100, $p^{(0)}(x)$ [less than threshold voltage, $V_7$], which normally is interpreted as "010," then the single-bit encoding of the cell in stage seven is interpreted as "0." Otherwise, if the signal level falls within the probability distribution function 101, $p^{(1)}(x)$ [greater than threshold voltage, $V_7$], which normally is interpreted as "011," then the single-bit encoding of the cell in stage seven is interpreted as "1." Note that the signal level normally interpreted as "010" can be used in either or both stages six and seven, but is interpreted differently in the two stages. As fast reading/decoding in the seventh programming stage, the low plane of TLC-NAND page could be read then decoded LP bit [0] as logic value [0] and LP bit [1] as logic value [1]. Meanwhile, the voltage values other than [010, 011] are errors and correctable by ECC process.

Figure 5C:
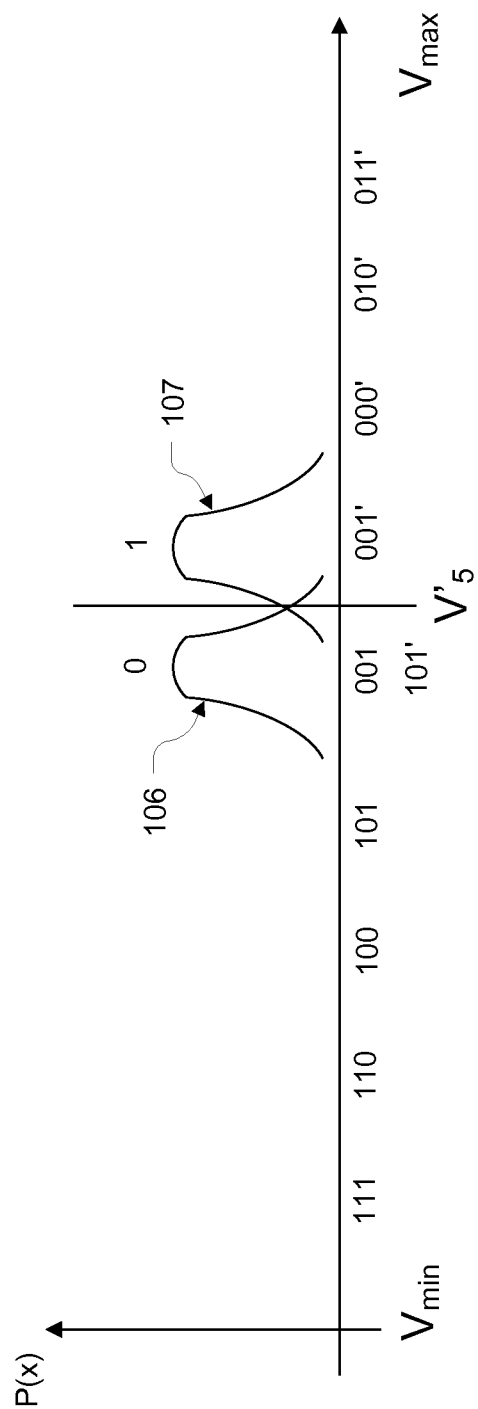

Furthermore, in other embodiments, the number of stages can be increased by shifting, or trimming, the reference voltages of some or all of the threshold voltages. By trimming and refreshing techniques, flash blocks can have longer endurance cycles with shorten retention periods for caching appliances. Referring to FIGS. 5A and 5B, the voltage thresholds are redefined for an exemplary erase-once-write-eight-times method. In FIG. 5A, the threshold voltages $V_1$ through $V_7$ are trimmed lower, which can result in better endurance and weaker retention. In FIG. 5B, threshold voltages $V'_1$ through $V'_7$ are trimmed high, which can result in better retention and normal endurance. The caching blocks, cells are erased then programmed multiple times per day, and mixed threshold voltages $V_1$ through $V'_7$ have been proportionally shifted to make room for an additional probability distribution function 102, 104, labeled "001" or "101'," in the center of the cell voltage range. The probability distribution functions 104, 105 are used in the fifth stage, that is, following the fifth write operation after an erasure, to decode the cell voltage level. If the signal level falls within the probability distribution function 104, $p^{(0)}(x)$ [less than threshold voltage, $V'_5$], labeled "101'," then the single-bit encoding of the cell in stage five is interpreted as logical "zero," or "0." Otherwise, if the signal level falls within the probability distribution function 105, $p^{(1)}(x)$ [greater than threshold voltage, $V'_5$], labeled "001'," then the single-bit encoding of the cell in stage five is interpreted as logical "one," or "1." In the first through fourth programming stages, the threshold voltages $V_1$ through $V_7$ are used. In the fifth through eighth programming stages, the threshold voltages $V'_1$ through $V'_7$ are used.

In an alternative embodiment, the threshold voltages can be further shifted, or trimmed, to make room for yet an additional probability distribution function, such that nine threshold voltages, $V_1$ through $V_9$, are defined. In this embodiment, an erase-once-write-nine-times method is implemented.

As will be appreciated by one of ordinary skill in the art, other embodiments can employ programming schemes with fewer than seven write operations, or stages, between erasures. For example, in an embodiment, an erase-once-write-four-times programming scheme uses the probability distribution functions of FIG. 4A in the first stage, following the first write operation after an erasure, to interpret the meaning of the cell voltage level; the probability distribution functions of FIG. 4C in the second stage, following the second write operation after an erasure; the probability distribution functions of FIG. 4E in the third stage, following the third write operation after an erasure; and the probability distribution functions of FIG. 4G in the fourth stage, following the fourth write operation after an erasure.

Figure 6:
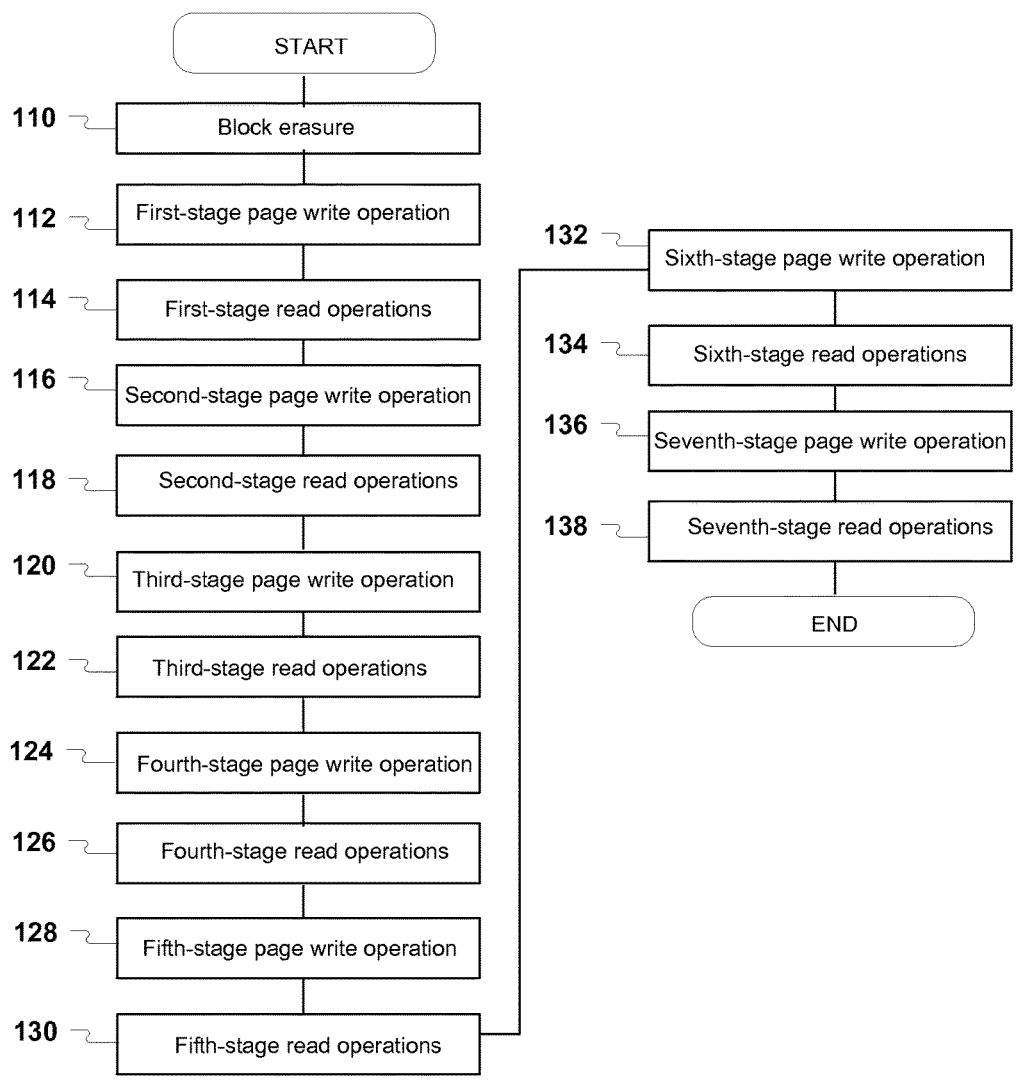
FIG. 6 is a flowchart representing a method of erasing and programming TLC-NAND flash memory in accordance with an embodiment of the present invention.

Referring now to FIG. 6, an exemplary process flow is illustrated that may be performed to implement an embodiment of the method described in this disclosure for programming a TLC-NAND storage using an erase-once-write-multiple-times process in order to increase the dynamic effective storage capacity and lifecycle of the TLC-NAND storage device. The TLC-NAND data-caching programming process begins at block 110, where a block of TLC-NAND flash cells are erased. That is, the floating gate of each of the cells in the block is discharged so that the threshold voltage required at the control gate of each of the cells in order to make the channel of each of the cells conductive is the $V_{min}$ defined for the TLC-NAND flash cells. In various embodiments, the number and organization of cells in the block varies, for example, approximately 384 pages then 8×16K+ spare cells per page; or approximately 128 pages then 3×8×(16K+ spare) cells per page; where the ECC spare cells vary a lot among Flash NAND vendors.

In association with the erase operation, as is known in the art, metadata is stored regarding the physical location of the block within the storage space, for example, in a data structure, such as a lookup table. In addition, metadata is stored regarding the current stage of the data stored in each block, for example, the number of programming operations that have been performed since the last erasure of the TLC-NAND flash block where each page currently is stored. In various embodiments, the metadata regarding the current stage of the data stored in the pages is either integrated into a metadata structure with the caching mode and physical location information or placed in a separate data structure, such as a lookup table in addition to page based flash translate layer (FTL) tables. Further, in an embodiment, information regarding how to interpret, or decode, the TLC-NAND flash cell contents in accordance with the various stages is stored in a metadata structure in 4bits per block, then the pages with previous data are marked as erased and ready for new data programming and pages with data of current written stages marked as programmed in related FTL tables.

In block 112, a programming, or write, operation is performed on a page of TLC-NAND flash cells in the block to program each cell with a binary value, or single bit of data, for example, either "0" or "1," instead of the normal three bits of data stored to TLC-NAND flash cells. Initially, as is known in the art, the stored metadata is accessed regarding the physical location of the page within the storage space. In addition, the stored metadata is accessed regarding the current stage of the data stored in the page. Further, information is accessed regarding how to format the TLC-NAND flash cell contents in accordance with the current stage.

During programming, the floating gate of each of the cells in the page is charged so that the voltage required at the control gate of each of the cells in order to make the channel of each of the cells floating gate charged to proper voltage levels, according cell voltage level set $\{V_1, V_2 \ldots V_7\}$, defined for programming the TLC-NAND flash cells. In various embodiments, the number of cells in the page varies among Flash NAND vendors. Trimming process can calibrate the reference voltage level set for longer endurance with shorter retentions or even have more than 7 reference voltage levels for caching usages.

In order to program the value "0" or "1" in the TLC-NAND flash cells, the 3 bit coding pattern "111" is programmed for the value "0" and coding pattern "110" is programmed for the value "1" in the TLC-NAND flash cells, the 16 KB+ spares {"0" or "1"} bit stream is programmed with {"111" or "110"} 3×(16 KB+ spares) coded 3bit stream.

In association with the write operation, metadata is stored regarding the current stage of the data stored in the page. In various embodiments, the metadata regarding the current stage of the data stored in the page is either integrated into a data structure with the physical location information or placed in a separate data structure, such as a corresponding FTL table to mark as programmed. Then, the same page programming operations are repeated, page by page, thru this block.

In block 114, a read operation is performed on the page of TLC-NAND flash cells that was programmed in block 112. Initially, as is known in the art, the stored metadata is accessed regarding the physical location of the page within the storage space. In addition, the stored metadata is accessed regarding the current stage of the data stored in the page. Further, information is accessed regarding how to interpret, or decode, the TLC-NAND flash cell contents in accordance with the current stage.

During the read operation, the same reference voltage set $\{V_1, V_2 \ldots V_7\}$ is applied in the write operation of block 112. Then, the first stage of the erase-once-write-multiple-times sequence, in block 114, the probability distribution function below the first threshold voltage, $V_1$, is interpreted as logical "zero," or "0," and the probability distribution function above the first threshold voltage, $V_1$, is interpreted as logical "one," or "1." For example, cell voltage level is within the probability distribution function 72 of FIG. 4A is read as "111" then decoded as "0," or within the probability distribution function 74 of FIG. 4A is read as "110" and decoded as "1." Fast reading and decoding method should be used as previous embodiment. The read operations in caching appliance can be multiple times, as long as less than 500 times or correctable ECC error bits are less than certain threshold. Otherwise, the corrected data should be re-programmed back to the same page as page refreshing for reliable future read ops.

In block 116, a second programming, or write, operation since the erasure of block 110 is performed on the page of TLC-NAND flash cells in the block to once again program each page with a coded {"110" or "100"} 3bits stream for binary value {"0" or "1"} bit stream. First of all, the stage metadata of this block is updated as the second programming and all pages' FTL tables are marked as erased ready for programming. During the write operation, the same reference voltage level set {$V_1, V_2 \ldots V_7$} used to program TLC-NAND flash cells.

In the second stage, in order to program the value "0" or "1" in the TLC-NAND flash cells, the 3 bit coding pattern "110" is programmed for the value "0" and coding pattern "100" is programmed for the value "1" in the TLC-NAND flash cells, the 16 KB+ spares {"0" or "1"} bit stream is programmed as {"111" or "110"} coded 3 bit stream. Then, the corresponding FTL table is marked as programmed. The same page programming operations are repeated page by page thru this block.

In block 118, a read operation is performed on the page of TLC-NAND flash cells. As above, the stored metadata is accessed regarding the physical location of the page, the current stage of the page data, and how to decode the TLC-NAND flash cell contents in accordance with the current stage. During the read operation, the second stage of the erase-once-write-multiple-times sequence in block 118, the probability distribution function below the second threshold voltage, $V_2$, is interpreted as logical "zero," or "0," and the probability distribution function above the second threshold voltage, $V_2$, is interpreted as logical "one," or "1." For example, cell voltage level is within the probability distribution function 76 of FIG. 4B is read as "110" then decoded as "0," or within the probability distribution function 78 of FIG. 4B is read as "100" and decoded as "1." Fast reading/decoding and page refreshing methods should be used as previous embodiment.

In block 120, a third programming, or write, operation since the erasure of block 110 is performed on the page of TLC-NAND flash cells to once again program each cell with a single bit of data. As above, the block programming metadata is updated as the third stage, and all pages' FTL tables are marked as erased and ready for programming.

In the third stage, in order to program the value "0" or "1" in the TLC-NAND flash cells, the 3 bit coding pattern "100" is programmed for the value "0" and coding pattern "101" is programmed for the value "1" in the TLC-NAND flash cells, the 16 KB+ spares {"0" or "1"} bit stream is programmed as {"100" or "101"} coded 3 bit stream. Then, the corresponding FTL table is marked as programmed. The same page programming operations are repeated page by page thru this block.

In block 122, a read operation is performed on the page of TLC-NAND flash cells. As above, the stored metadata is accessed regarding the physical location of the page, the current stage of the page data, and how to interpret the TLC-NAND flash cell contents in accordance with the current stage. During the third stage the erase-once-write-multiple-times sequence, in block 122, the probability distribution function below the third threshold voltage, $V_3$, is interpreted as logical "zero," or "0," and the probability distribution function above the third threshold voltage, $V_3$, is interpreted as logical "one," or "1." For example, cell voltage level is within the probability distribution function 82 of FIG. 4C is read as "100" then decoded as "0," or within the probability distribution function 84 of FIG. 4C is read as "101" and decoded as "1." Fast reading/decoding and page refreshing methods should be used as previous embodiment.

In block 124, a fourth write operation since the erasure of block 110 is performed on the page of TLC-NAND flash cells. As above, the stored metadata is updated as the fourth programming stage and all page FTL tables marked as erased and ready for programming. Then, the data bit "0" is programmed as "101" and bit "1" is programmed as "001" in the fourth stage for all cells of a page. After page written, the page FTL table is updated as programmed. The same programming operations repeated, page by page thru this block.

In block 126, a read operation is performed on the page. As above, the stored metadata and FTL table are accessed regarding the physical location of the page, the current stage of the page data, and how to decode the TLC-NAND flash cell contents in accordance with the current stage. During the fourth stage of the erase-once-write-multiple-times sequence, in block 126, the probability distribution function below the fourth threshold voltage, $V_4$, is interpreted as logical "zero," or "0," and the probability distribution function above the fourth threshold voltage, $V_4$, is interpreted as logical "one," or "1." For example, cell voltage level is within the probability distribution function 86 of FIG. 4D is read as "101" then decoded as "0," or within the probability distribution function 88 of FIG. 4D is read as "001" and decoded as "1." Fast reading/decoding and page refreshing methods should be used as previous embodiment.

In block 128, a fifth write operation since the erasure of block 110 is performed on the page. As above, the stored metadata is updated as the fifth programming stage, and all page FTL tables are marked as erased and ready for programming. In the fifth stage, a data bit "0" is programmed as "001" and bit "1" is programmed as "000" for all cells in a page. Then, the page FTL table is updated as programmed. The same programming operations repeated, page by page thru this block.

In block 130, a read operation is performed on the page. As above, the stored metadata and FTL table are accessed regarding the physical location of the page, the current stage of the page data, and how to decode the TLC-NAND flash cell contents in accordance with the current stage. During the fifth stage of the erase-once-write-multiple-times sequence, in block 130, the probability distribution function below the fifth threshold voltage, $V_5$, is interpreted as logical "zero," or "0," and the probability distribution function above the fifth threshold voltage, $V_5$, is interpreted as logical "one," or "1." For example, cell voltage level is within the probability distribution function 92 of FIG. 4E is read as "001" then decoded as "0," or within the probability distribution function 94 of FIG. 4E is read as "000" and decoded as "1." Fast reading/decoding and page refreshing methods should be used as previous embodiment.

In block 132, a sixth write operation since the erasure of block 110 is performed on the page. As above, the stored metadata is updated as the sixth programming stage, and all page FTL tables are marked as erased and ready for programming. In the sixth stage, a data bit "0" is programmed as "000" and bit "1" is programmed as "010" for all cells in a page. Then, the page FTL table is updated as programmed. The same programming operations repeated, page by page thru this block.

In block 134, a read operation is performed on the page. As above, the stored metadata and FTL table are accessed regarding the physical location of the page, the current stage of the page data, and how to decode the TLC-NAND flash cell contents in accordance with the current stage. During the sixth stage of the erase-once-write-multiple-times sequence, in block 134, the probability distribution function below the sixth threshold voltage, $V_6$, is interpreted as logical "zero," or "0," and the probability distribution function above the sixth threshold voltage, $V_6$, is interpreted as logical "one," or "1." For example, cell voltage level is within the probability distribution function 96 of FIG. 4F is read as "000" then decoded as "0," or within the probability distribution function 98 of FIG. 4F is read as "010" and decoded as "1." Fast reading/decoding and page refreshing methods should be used as previous embodiment.

In block 136, a seventh write operation since the erasure of block 110 is performed on the page. As above, the stored metadata is updated as the seventh programming stage, and all page FTL tables are marked as erased and ready for programming. In the seventh stage, a data bit "0" is programmed as "010" and bit "1" is programmed as "011" for all cells in a page. Then, the page FTL table is updated as programmed. The same programming operations repeated, page by page thru this block.

In block 138, a read operation is performed on the page. As above, the stored metadata and FTL table are accessed regarding the physical location of the page, the current stage of the page data, and how to decode the TLC-NAND flash cell contents in accordance with the current stage. During the seventh stage of the erase-once-write-multiple-times sequence, in block 138, the probability distribution function below the seventh threshold voltage, $V_7$, is interpreted as logical "zero," or "0," and the probability distribution function above the seventh threshold voltage, $V_7$, is interpreted as logical "one," or "1." For example, cell voltage level is within the probability distribution function 100 of FIG. 4G is read as "010" then decoded as "0," or within the probability distribution function 101 of FIG. 4G is read as "011" and decoded as "1." Fast reading/decoding and page refreshing methods should be used as previous embodiment. This method can expand TLC-NAND cell dynamic capacity to effectively cache seven bits of data per erasure in system-caching applications.

In alternative embodiments, depending on the physical configuration and organization of the TLC-NAND flash cells, read operations can be performed on combinations of cells across more than one page, on combinations of cells smaller than a page, or on an individual cell.

Figure 7:
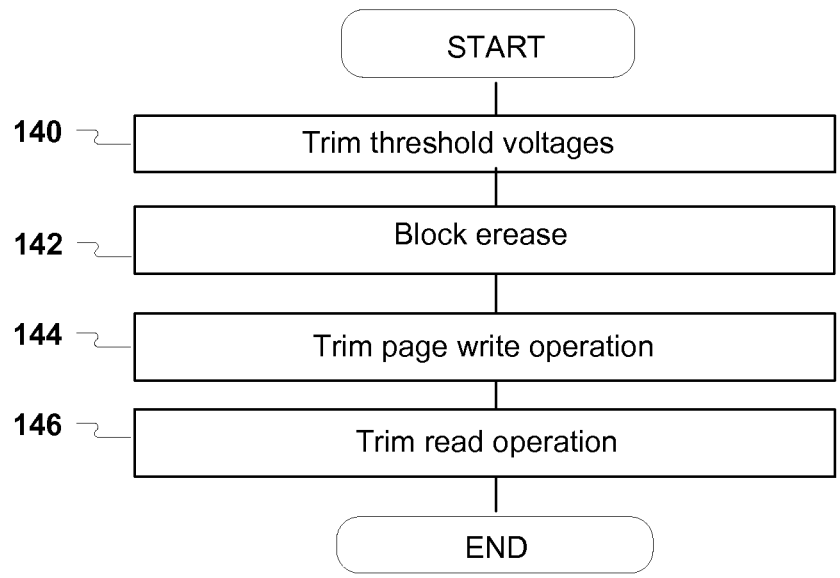
FIG. 7 is a flowchart representing a method of trimming, erasing and programming TLC-NAND flash memory in accordance with an embodiment of the present invention.

In other embodiments, the reference voltages corresponding to the TLC-NAND flash cell threshold voltage levels can be controlled and manipulated to change the total number of threshold voltages, and thus, the number of times the TLC-NAND cells can be programmed between erasures. Referring to FIG. 7, an exemplary process flow is illustrated that may be performed to implement an embodiment of a method for programming a TLC-NAND storage using a threshold voltage trimming process combined with an erase-once-write-multiple-times process in order to increase the effective storage capacity and lifecycle of the TLC-NAND storage device.

The process begins at block 140, where the reference voltages corresponding to each of the threshold voltages, $V_1$ through $V_7$, are shifted, or trimmed, in order to insert an additional threshold voltage as $\{V_1\ V_2\ V_3\ V_4\ V'_4\ V'_5\ V'_6\ V'_7\}$. For example, an additional threshold voltage, $V_8$ or $V'_7$, can be inserted to create a total storage capacity of nine data values, such as that illustrated in FIG. 5C, where the threshold voltages $V'_1$ through $V'_7$ have been changed to use shifted coding patterns, labeled "101' 001' 000' 010' 011'," in the center of the TLC-NAND flash cell voltage range, for the fifth through eighth programming stage and reading cells. In the first through fourth programming stages, the normal coding patterns and fast reading methods are used as previous embodiments.

Of course, in various embodiments, the additional threshold voltage and data point can equivalently be abstractly visualized at any point along the voltage range. As one skilled in the art will readily understand, in the configurations of FIGS. 5A through 5C, the other seven threshold voltages are adjusted proportionally away from the center of the voltage range in order to accommodate the eighth threshold voltage. Equivalently, for example, in various embodiments, $V_1$ through $V_7$ and $V'_1$ through $V'_7$ can be adjusted proportionally in one direction to accommodate more additional threshold voltage, $V_9$, at either end of the voltage range.

In block 142, a block of TLC-NAND flash cells are erased, as explained above. As above, in association with the erase operation, metadata is stored regarding the physical location of the block within the storage space, for example, in a data structure, such as a lookup table. In addition, metadata is stored regarding the current stage of the data stored in the page, for example, the number of programming operations that have been performed since the last erasure of the TLC-NAND flash cells where the page data currently is stored. In various embodiments, the metadata regarding the current stage of the data stored in the page is either integrated into a data structure with the physical location information or placed in a separate data structure, such as a lookup table. Further, in an embodiment, information regarding how to interpret, or decode, the TLC-NAND flash cell contents in accordance with the various stages is stored in a data structure.

In block 144, a programming, or write, operation is performed on a page of TLC-NAND flash cells in the block to program each cell with a single bit of data, either logical "zero," or "0" or "1," essentially as described above. As explained above, the stored metadata is accessed regarding the physical location of the page, the current stage of the page data, and how to format the TLC-NAND flash cell contents in accordance with the current stage. Depending on the current stage corresponding to the TLC-NAND flash cells, that is, the number of times the cells have been programmed since the erasure in block 142, the cell voltage level is set within the probability distribution function below/above the corresponding threshold voltage, $V_1$ through $V_8$. In this manner, each TLC-NAND flash cell can be programmed with a single data bit up to eight times between erasures.

As above, in association with the write operation metadata is stored regarding the current stage of the data stored in the page. In various embodiments, the metadata regarding the current stage of the data stored in the page is either integrated into a data structure with the physical location information or placed in a separate data structure, such as a lookup table.

In block 146, a read operation is performed on the page that was programmed in block 144, essentially as described above. As explained above, the stored metadata is accessed regarding the physical location of the page, the current stage of the page data, and how to interpret the TLC-NAND flash cell contents in accordance with the current stage. Following the write operation of block 144, depending on the current stage of the erase-once-write-multiple-times sequence, in block 114, the probability distribution function below the first threshold voltage, $V_1$, is interpreted as logical "zero," or "0," and the probability distribution function above the first threshold voltage, $V_1$, is interpreted as logical "one," or "1." This method can expand TLC-NAND cell dynamic capacity to effectively cache eight bits of data per erasure in system-caching applications.

Of course, a person of ordinary skill in the art will readily apprehend that the data-caching programming method can be generalized for application in NAND flash cells that are configured for any practical number of threshold voltages.

Thus, to the extent the accuracy and reliability of physical NAND flash cells permit more than seven voltage thresholds, such as ten voltage thresholds, twelve voltage thresholds, fifteen voltage thresholds, or any number of practical voltage thresholds, the number of write operations performed between erasures can be increased proportionally.

In some embodiments, the primary storage and caching apparatus 38 incorporates centralized low density parity check (LDPC) error-correcting code (ECC) at the fabric networking nodes, or memory array controllers 18, and does not implement LDPC-ECC at the individual distributed SSD controllers onboard the flash memory modules 16. The apparatus 18 delivers impaired data, for example, data known to include erroneous stored data, to clients and allow the clients to apply LDPC forward error correction (FEC) concepts in order to correct the errors at the distributed client sites. Exemplary applications include mobile cloud storage, since some existing smart mobile devices implement TLC-NAND media and LDPC-ECC decoding, and some existing wireless or WiFi gateways, including cell-phone towers, could implement LDPC-FEC for latency devices.

As is known in the art, error-correcting code is used in NAND flash to compensate for bits with erroneous stored data, for example, data that spontaneously fails during normal device operation. Errors are corrected by LDPC hard decoding with low-power and high-efficiency circuits to minimize power consumption. In addition, the LDPC soft-decoding digital signal processing algorithm provides an additional level of error correction by voltage threshold tracking Further, on-chip redundant array of independent disks (RAID) with page parity is used for recovery of uncorrectable data.

Thus, for example, at each write operation, LDPC-ECC check-bits may be written for 3-times error-correctability (for example, one bit to store the data value, two bits for error-rate measurement in message-bits, and three bits for LDPC-ECC check-bits). An LDPC-decoder counts the error bits from the two-bit fixed-pattern to estimate the log likelihood ration (LLR) for the soft-decoder to iterate one-bit message-bits. LDPC is used, for example, to increase SSD endurance by accommodating "stuck" cells, as well as to protect against SSD thermal noise.

In other embodiments, two-dimensional erasure coding (EC) parities are applied "horizontally" ($P_h$) across each flash memory data storage array 12 (referring to FIGS. 1 & 2) to protect against TLC-NAND device and module failures, and "vertically" ($P_y$ and $Q_y$) among the multiple arrays 12 in the array cluster 40 to protect against networking controller failures. For example, erasure coding may be implemented as (N-2) data with 2parities in each dimension. As data-pages are deleted, these remain available for EC recover calculations, because the parities need only be updated at erasure time. The parities are updated by reading the old parity blocks, erasing the data blocks, then performing an "XOR" operation on the new data as parity blocks of reduced length striple, for example, from N+2 down to N−1+2.

EC is implemented to protect against TLC-NAND flash cell failures, relatively long cmd-queues or relatively long LDPC decoding iterations. The horizontal and vertical parities are calculated based on data in the journaling cache, rather than being read from the TLC-NAND flash modules, in order to enable relatively fast programming operations.

In yet other embodiments, as is further known in the art, the data may be compressed before being written to the TLC-NAND flash cells. For example, a compression technique known in the art, such as zip compression, may be applied to the data before programming. The storage space that is conserved by the compression technique may be used for additional page-writes.

Figure 8:
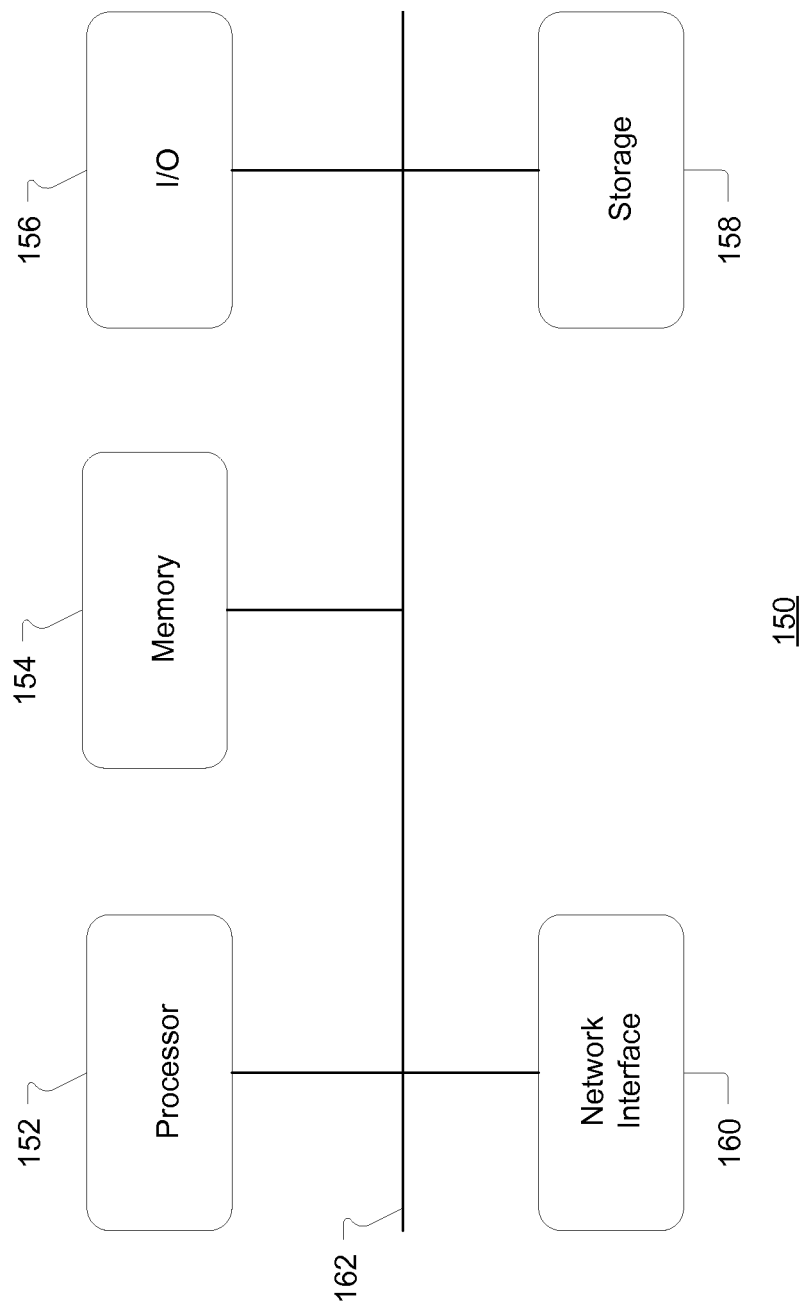
FIG. 8 is a schematic view depicting a computing system that can implement a method of erasing and programming TLC-NAND flash memory in accordance with an embodiment of the present invention.

As illustrated in FIG. 8, an exemplary computing device 150 that can be employed in the apparatus 38 of FIG. 2 includes a processor 152, a memory 154, an input/output device (I/O) 156 storage 158 and a network interface 160. The various components of the computing device 150 are coupled by a local data link 162, which in various embodiments incorporates, for example, an address bus, a data bus, a serial bus, a parallel bus, or any combination of these.

The computing device 150 communicates information to and requests input from the user or other devices by way of the I/O 156, which in various embodiments incorporates, for example, an interactive, menu-driven, visual display-based user interface, or graphical user interface (GUI), a pointing device, such as a, with which the user may interactively input information using direct manipulation of the GUI. In some embodiments, direct manipulation includes the use of an alphanumeric input device, such as a keyboard, a pointing device, such as a mouse, a touchpad, a trackball, a joystick or a stylus, to select from a variety of windows, icons and selectable fields, including selectable menus, drop-down menus, tabs, buttons, bullets, checkboxes, text boxes, and the like. Nevertheless, various embodiments of the invention may incorporate any number of additional functional user interface schemes in place of this interface scheme, with or without the use of an alphanumeric input device, a pointing device, buttons or keys, for example, using direct voice input.

The computing device 150 is coupled to a communication network by way of the network interface 160, which in various embodiments incorporates, for example, any combination of devices—as well as any associated software or firmware—configured to couple processor-based systems, including modems, access points, network interface cards, LAN or WAN interfaces, wireless or optical interfaces and the like, along with any associated transmission protocols, as may be desired or required by the design.

The computing device 150 can be used, for example, to implement the method of analyzing biophysiological periodic data of FIG. 1. In various embodiments, the computing device 150 can include, for example, a server, a controller, a workstation, a mainframe computer, personal computer (PC), a note pad, a computing tablet, a personal digital assistant (PDA), a smart phone, a wearable device, or the like. Programming code, such as source code, object code or executable code, stored on a computer-readable medium, such as the storage 158 or a peripheral storage component coupled to the computing device 150, can be loaded into the memory 154 and executed by the processor 152 in order to perform the functions of the method of cache-data programming of FIG. 6.

Aspects of this disclosure are described herein with reference to flowchart illustrations or block diagrams, in which each block or any combination of blocks can be implemented by computer program instructions. The instructions may be provided to a processor of a general purpose computer, special purpose computer, or other programmable data processing apparatus to effectuate a machine or article of manufacture, and when executed by the processor the instructions create means for implementing the functions, acts or events specified in each block or combination of blocks in the diagrams.

In this regard, each block in the flowchart or block diagrams may correspond to a module, segment, or portion of code that including one or more executable instructions for implementing the specified logical function(s). It should also be noted that, in some alternative implementations, the functionality associated with any block may occur out of the order noted in the figures. For example, two blocks shown in succession may, in fact, be executed substantially concurrently, or blocks may sometimes be executed in reverse order.

A person of ordinary skill in the art will appreciate that aspects of this disclosure may be embodied as a device, system, method or computer program product. Accordingly, aspects of this disclosure, generally referred to herein as circuits, modules, components or systems, may be embodied in hardware, in software (including firmware, resident software, micro-code, etc.), or in any combination of software and hardware, including computer program products embodied in a computer-readable medium having computer-readable program code embodied thereon.

Computer program code for carrying out operations regarding aspects of this disclosure may be written in any combination of one or more programming languages, including object oriented programming languages such as Java, Smalltalk, C++, or the like, as well as conventional procedural programming languages, such as the "C," FORTRAN, COBOL, Pascal, or the like. The program code may execute entirely on an individual personal computer, as a stand-alone software package, partly on a client computer and partly on a remote server computer, entirely on a remote server or computer, or on a cluster of distributed computer nodes. In general, a remote computer, server or cluster of distributed computer nodes may be connected to an individual (user) computer through any type of network, including a local area network (LAN), a wide area network (WAN), an Internet access point, or any combination of these.

It will be understood that various modifications may be made. For example, useful results still could be achieved if steps of the disclosed techniques were performed in a different order, and/or if components in the disclosed systems were combined in a different manner and/or replaced or supplemented by other components. Accordingly, other implementations are within the scope of the following claims.

What is claimed is:

1. A method for storing and caching data in an all-flash-array, comprising:
    erasing, with a processor, a triple-level cell (TLC) flash cell;
    programming the TLC flash cell with a one of first and second sequential voltage levels selected from a plurality of sequential voltage levels, to represent a binary single bit of data, for multiple times in sequence, the first and second sequential voltage levels increasing with each stage relative to the respective first and second sequential voltage levels of an immediately previous stage of multiple sequential stages between erasures for erasing once then writing multiple times to the TLC flash cell, wherein the first and second sequential voltage levels increase such that the first sequential voltage level of a current stage corresponds to the second sequential voltage level of the immediately previous stage to the current stage;
    processing the binary single bit of data in relation to a respective threshold voltage corresponding to the respective first and second voltage sequential voltage levels for a current stage of the multiple sequential stages; and
    storing first metadata corresponding to the current stage of the multiple sequential stages associated with a number of times the TLC flash cell has been programmed since being erased as one of eight sequential metadata values per written page.

2. The method of claim 1, wherein programming the TLC flash cell with the one of the first and second sequential voltage levels comprises setting a cell voltage level of the TLC flash cell within a first probability distribution function having a first orientation with respect to the respective threshold voltage or within a second probability distribution function having a second orientation with respect to the respective threshold voltage, wherein the binary single bit of data equals a first logical state when the cell voltage level is within the first probability distribution function or a second logical state when the cell voltage level is within the second probability distribution function.

3. The method of claim 2, wherein the first probability distribution function forms a mirror image of the second probability distribution function about an axis of the threshold voltage.

4. The method of claim 1, further comprising storing second metadata defining a correlation between a plurality of threshold voltages and the multiple sequential stages, wherein at the multiple sequential stages the respective threshold voltage corresponds to one of the plurality of threshold voltages.

5. The method of claim 1, wherein programming the TLC flash cell with the one of the respective first and second sequential voltage levels multiple times in sequence corresponding to multiple sequential stages between erasures further comprises programming the TLC flash cell with a plurality of different voltage levels of the plurality of sequential voltage levels, each voltage level representing a respective binary single bit of data, up to seven times in sequence corresponding to up to seven sequential stages between erasures; and
    processing the binary single bit of data in relation to a respective threshold voltage at the multiple sequential stages further comprises interpreting each binary single bit of data in relation to one of seven threshold voltages at the up to seven sequential stages.

6. The method of claim 5, wherein the seven threshold voltages correspond to those used to decode three-bit data alternately stored in the TLC flash cell.

7. The method of claim 1, further comprising periodically rotating a cache region comprising the TLC flash cell through a TLC flash storage space.

8. The method of claim 7, wherein at any time the cache region occupies no more than one-tenth of the TLC flash storage space.

9. The method of claim 1, further comprising:
    trimming a plurality of threshold voltages associated with the TLC flash cell; and
    inserting an additional threshold voltage;
    wherein programming the TLC flash cell with the one of the respective first and second sequential voltage levels multiple times in sequence corresponding to multiple sequential stages between erasures further comprises programming the TLC flash cell with first and second voltage levels of a plurality of successive voltage levels, each representing a respective binary single bit of data, up to eight times in sequence corresponding to up to eight sequential stages between erasures, and processing the binary single bit of data in relation to the respective threshold voltage at the multiple sequential stages further comprises interpreting each of the binary single bits of data in relation to one of eight threshold voltages at the up to eight sequential stages.

10. A method for storing and caching data in an all-flash-array, comprising:
    erasing, with a processor, a triple-level cell (TLC) flash cell;
    programming a first cell voltage level for a first stage of the TLC flash cell, the first cell voltage level corresponding to a first single-bit binary value, wherein the first single-bit binary value equals a first logical state when the first cell voltage level is within a first probability distribution function having a first orientation with respect to a first threshold voltage or a second logical state when the first cell voltage level is within a second probability distribution function having a second orientation with respect to the first threshold voltage, wherein the first threshold voltage is selected from a plurality of sequential threshold voltages, each selected threshold voltage representing a respective stage of a plurality of sequential stages, wherein the threshold voltage increases with each stage such that, in a second stage, a second single-bit binary value equals the first logical state when the first cell voltage level is within the first probability distribution having the first orientation with respect to a second threshold voltage of the plurality of sequential threshold voltages and having the second orientation with respect to the first threshold voltage, and wherein each stage has a stage value associated with a number of times the TLC flash cell has been programmed since the TLC flash cell last was erased; and
    storing a first stage value associated with a current stage of the plurality of sequential stages.

11. The method of claim 10, further comprising:
    programming a second cell voltage level of the TLC flash cell corresponding to the second binary value, wherein the second binary value equals the first logical state when the second cell voltage level is within the second probability distribution function having the first orientation with respect to the second threshold voltage sequentially selected from the plurality of threshold voltages or the second logical state when the second cell voltage level is within a third probability distribution function having the second orientation with respect to the second threshold voltage; and
    storing a second stage value associated with the number of times the TLC flash cell has been programmed since the TLC flash cell last was erased.

12. The method of claim 11, further comprising:
    programming a third cell voltage level of the TLC flash cell corresponding to a third binary value, wherein the third binary value equals the first logical state when the third cell voltage level is within the third probability distribution function having the first orientation with respect to a third threshold voltage sequentially selected from the plurality of threshold voltages or the second logical state when the third cell voltage level is within a fourth probability distribution function having the second orientation with respect to the third threshold voltage; and
    storing a third stage value associated with the number of times the TLC flash cell has been programmed since the TLC flash cell last was erased.

13. The method of claim 12, further comprising:
    programming a fourth cell voltage level of the TLC flash cell corresponding to a fourth binary value, wherein the fourth binary value equals the first logical state when the fourth cell voltage level is within the fourth probability distribution function having the first orientation with respect to a fourth threshold voltage sequentially selected from the plurality of threshold voltages or the second logical state when the fourth cell voltage level is within a fifth probability distribution function having the second orientation with respect to the fourth threshold voltage; and
    storing a fourth stage value associated with the number of times the TLC flash cell has been programmed since the TLC flash cell last was erased.

14. The method of claim 13, further comprising:
    programming a fifth cell voltage level of the TLC flash cell corresponding to a fifth binary value, wherein the fifth binary value equals the first logical state when the fifth cell voltage level is within the fifth probability distribution function having the first orientation with respect to a fifth threshold voltage sequentially selected from the plurality of threshold voltages or the second logical state when the fifth cell voltage level is within a sixth probability distribution function having the second orientation with respect to the fifth threshold voltage; and
    storing a fifth stage value associated with the number of times the TLC flash cell has been programmed since the TLC flash cell last was erased.

15. The method of claim 14, further comprising:
    programming a sixth cell voltage level of the TLC flash cell corresponding to a sixth binary value, wherein the sixth binary value equals the first logical state when the sixth cell voltage level is within the sixth probability distribution function having the first orientation with respect to a sixth threshold voltage or the second logical state when the sixth cell voltage level is within a seventh probability distribution function having the second orientation with respect to the sixth threshold voltage; and
    storing a sixth stage value associated with the number of times the TLC flash cell has been programmed since the TLC flash cell last was erased.

16. The method of claim 15, further comprising:
    programming a seventh cell voltage level of the TLC flash cell corresponding to a seventh binary value, wherein the seventh binary value equals the first logical state when the seventh cell voltage level is within the seventh probability distribution function having the first orientation with respect to a seventh threshold voltage or the second logical state when the seventh cell voltage level is within an eighth probability distribution function having the second orientation with respect to the seventh threshold voltage; and
    storing a seventh stage value associated with the number of times the TLC flash cell has been programmed since the TLC flash cell last was erased.

17. The method of claim 16, wherein the first through seventh threshold voltages correspond to those used to decode three-bit data alternately stored in the TLC flash cell.

18. The method of claim 10, further comprising:
    reading a current stage value corresponding to the TLC flash cell; and
    determining a current cell voltage level of the TLC flash cell corresponding to a current binary value stored in the TLC flash cell, wherein the current binary value equals the first logical state when the current cell voltage level is within the first probability distribution function or the second logical state when the current cell voltage level is within the second probability distribution function.

19. The method of claim 10, further comprising periodically rotating a cache region comprising the TLC flash cell through a TLC flash storage space.

20. The method of claim 19, wherein at any time the cache region occupies no more than one-tenth of the TLC flash storage space.

21. The method of claim 20, further comprising storing non-cache primary storage data in at least a portion of the TLC flash storage space other than the cache region.

22. An apparatus for storing and caching data in an all-flash-array, comprising:
an array of flash memory modules comprising a plurality of triple-level cell (TLC) devices;
a memory array controller coupled to the array of flash memory modules to manage data transfer to and from the array of flash memory modules; and
a remote direct memory access manager to manage data transfer to and from the apparatus;
wherein at any time no more than a predetermined percent of the TLC devices are dedicated to a cache region and at least a portion of a remaining TLC device is dedicated to non-cache primary storage, the TLC devices dedicated to the cache region are programmed with voltage levels corresponding to respective three-bit coding patterns, that each represent a respective binary single bit of data, multiple times in sequence corresponding to multiple sequential stages between erasures, and the respective binary single bits of data are processed in relation to a respectively different threshold voltage during each of the multiple sequential stages, such that, for a current stage, a voltage level representing a logic-0 binary bit is less than the threshold voltage of the current stage and a voltage level representing a logic-1 binary bit is greater than the threshold voltage of the current stage, wherein the voltage level representing the logic-0 binary bit is greater than a previous threshold voltage of an immediately previous stage to the current stage and in the immediately previous stage to the current stage, the voltage level representing the logic-0 binary bit is less than the previous threshold voltage of the immediately previous stage to the current stage.

23. The apparatus of claim 22, wherein the cache region is periodically rotated through the array of flash memory modules.

24. The apparatus of claim 22, further comprising an erasure code controller to apply two-dimensional erasure code parities across the array and between the array and at least an additional array of flash memory modules to protect data stored in the array.

25. A method for storing and caching data in an all-flash-array, comprising erasing, with a processor, a quad-level cell (QLC) flash cell;
programming the QLC flash cell with voltage levels corresponding to a plurality of different four-bit coding patterns, each voltage level representing a respective binary single bit of data, up to fifteen times in sequence corresponding to up to fifteen sequential stages between erasures;
interpreting each respective voltage level in relation to one of fifteen threshold voltages at the up to fifteen sequential stages, such that, for a current stage, a voltage level representing logic-0 binary bit is less than a current threshold voltage of the current stage and a voltage level representing a logic-1 binary bit is greater than the threshold voltage of the current stage, wherein the voltage level representing the logic-0 binary bit is greater than a previous threshold voltage of an immediately previous stage to the current stage and in the immediately previous stage to the current stage, the voltage level representing the logic-0 binary bit is less than the previous threshold voltage of the immediately previous stage to the current stage; and
storing first metadata corresponding to a current stage of the up to fifteen sequential stages associated with a number of times the QLC flash cell has been programmed since being erased.

* * * * *

UNITED STATES PATENT AND TRADEMARK OFFICE
CERTIFICATE OF CORRECTION

PATENT NO. : 10,042,565 B2
APPLICATION NO. : 14/729817
DATED : August 7, 2018
INVENTOR(S) : Xiaobing Lee It is certified that error appears in the above-identified patent and that said Letters Patent is hereby corrected as shown below:

In the Drawings

Sheet 11 of 12, Fig. 7, reference numeral 142, Line 1, delete "erease" and insert --erase-- therefor In the Specification In Column 4, Line 64, delete "12," and insert --10,-- therefor In Column 6, Line 18, delete "[110.]" and insert --[110].-- therefor In Column 6, Line 66, delete "101 ]" and insert --101]-- therefor In Column 7, Line 6, delete ""100, "" and insert --"100,"-- therefor In Column 7, Line 10, delete ""101, "" and insert --"101,"-- therefor In Column 7, Line 23, delete "[001.]" and insert --[001].-- therefor In Column 7, Line 32, delete ""001, "" and insert --"001,"-- therefor In Column 7, Line 55, delete ""000, "" and insert --"000,"-- therefor In Column 8, Line 4, delete ""000, "" and insert --"000,"-- therefor In Column 8, Line 9, delete ""010, "" and insert --"010,"-- therefor In Column 8, Line 66, delete ""001,'" and insert --"001',"-- therefor In Column 15, Line 13, delete "18" and insert --38-- therefor Signed and Sealed this
Fourth Day of June, 2019

Andrei Iancu
*Director of the United States Patent and Trademark Office*

CERTIFICATE OF CORRECTION (continued)
U.S. Pat. No. 10,042,565 B2

In Column 15, Line 30, after "tracking", insert --.--

In Column 15, Line 50, delete "2parities" and insert --2 parities-- therefor